(12) United States Patent
Liu et al.

(10) Patent No.: US 9,465,151 B2
(45) Date of Patent: Oct. 11, 2016

(54) PHOTOSENSITIVE RESIN COMPOSITION AND COLOR FILTER

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiaona Liu, Beijing (CN); Yongzhi Song, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 230 days.

(21) Appl. No.: 14/314,733

(22) Filed: Jun. 25, 2014

(65) Prior Publication Data

US 2015/0293278 A1   Oct. 15, 2015

(30) Foreign Application Priority Data

Apr. 14, 2014   (CN) .......................... 2014 1 0149062

(51) Int. Cl.
| | |
|---|---|
| G02B 5/23 | (2006.01) |
| G02F 1/1335 | (2006.01) |
| G02B 5/22 | (2006.01) |
| G03F 7/00 | (2006.01) |
| C08J 7/18 | (2006.01) |

(52) U.S. Cl.
CPC ......... *G02B 5/223* (2013.01); *G02F 1/133514* (2013.01); *G03F 7/0007* (2013.01); *G02F 2201/086* (2013.01)

(58) Field of Classification Search
USPC .......... 252/586; 349/106; 359/885; 427/256, 427/511, 514; 430/7, 270.1, 281.1, 321, 430/286.1; 522/33, 39, 56, 64, 67, 66, 81, 522/82, 83, 111
See application file for complete search history.

(56) References Cited

U.S. PATENT DOCUMENTS

| | | | | |
|---|---|---|---|---|
| 6,667,148 B1 * | 12/2003 | Rao | ..................... | G03C 1/49872 430/350 |
| 2003/0229240 A1 * | 12/2003 | Rampf | .................. | C07F 9/5442 556/9 |
| 2010/0020274 A1 * | 1/2010 | Zhang | ................. | C09B 67/0069 349/106 |
| 2011/0123723 A1 * | 5/2011 | Yang | ..................... | G03F 7/0007 427/514 |

* cited by examiner

*Primary Examiner* — Bijan Ahvazi
(74) *Attorney, Agent, or Firm* — Harness, Dickey & Pierce, P.L.C.

(57) ABSTRACT

The invention discloses a photosensitive resin composition and a color filter. The photosensitive resin composition comprises, by weight of the photosensitive resin composition, 0.6%-2% silver halide, 0.06%-0.7% oxidant, 5%-15% the second dispersion resin, 5%-10% light-polymerizable compound, 25%-57% pigment dispersion, 0.05%-0.06% light polymerization initiator and 28.5%-60% solvent. When placed under a strong ultraviolet light irradiation condition, the color filter exhibits black and barriers the ultraviolet light; and when placed in a visible light range, the color filter recovers the original color.

16 Claims, No Drawings

PHOTOSENSITIVE RESIN COMPOSITION AND COLOR FILTER

CROSS-REFERENCE TO RELATED APPLICATION

The present application claims priority to and incorporates by reference the entire contents of Chinese priority document 201410149062.9, filed in China on Apr. 14, 2014.

TECHNICAL FIELD

The present invention relates to the field of color filter technologies, and in particular, to a photosensitive resin composition and a color filter.

BACKGROUND

Color filter is a key component of a liquid crystal display to realize color display. The main function of a traditional color filter is to make a white light emitted by a backlight source become chromatic colors by using three primary colors, i.e., red, blue and green, and to realize color display. A color filter is mainly made of a photosensitive resin composition. In the prior art, the photosensitive resin composition is consisted of a pigment, a photoactive polymer, a photoactive monomer, a dispersion resin, a solvent, a photoinitiator, a surfactant and an additive. A color filter is made of a photosensitive resin composition via a film-forming process.

The traditional color filter has no filtration action on an ultraviolet light, and it is located inside a display screen, thus the liquid crystal material for realizing a switching function is prone to be influenced by an ultraviolet light, so that problems such as aging and the like may occur, thereby the product quality will be influenced. Therefore, during the process flow of sealant ultraviolet curing, the region in which the liquid crystal exists must be sheltered by a mask plate, thus it may be avoided that the liquid crystal is irradiated by the ultraviolet and the molecular structure of the liquid crystal is destroyed. The utilization of a mask plate has the following disadvantages: (1) the shading region of the mask plate is a metallic layer with a certain thickness on the surface of a glass substrate, and the metallic layer tends to drop out and break under a long time of strong ultraviolet irradiation, as a result, the consumption will be large; (2) the regions in which the liquid crystal exists have different areas and locations for products with different sizes, thus a mask plate needs to be manufactured individually for each product for the sheltering of the ultraviolet light; (3) the mask plate is placed at 0-0.3 cm above a TFT-LCD glass via vac-sorb, and the backing materials of the mask plate and the TFT-LCD are both glass, thus electrostatic adsorption is prone to occur, which may cause the mask plate to drop out and cause the device unable to work.

SUMMARY

It is an object of the invention to provide a photosensitive resin composition and a color filter.

The photosensitive resin composition according to the invention comprises, by weight of the photosensitive resin composition, 0.6%-2% silver halide, 0.06%-0.7% oxidant, 5%-15% the second dispersion resin, 5%-10% light-polymerizable compound, 25%-57% pigment dispersion, 0.05%-0.06% light polymerization initiator and 28.5%-60% solvent.

The oxidant is at least one selected from cuprous bromide-dimethyl thioether complex, copper(I) iodide-trimethyl phosphorous acid complex and copper(I) iodide-triethyl phosphorous acid complex.

The second dispersion resin is aromatic acid acrylate, styrene-maleic anhydride copolymer, polyurethane acrylate, hydroxyl group-containing polyester acrylate or a combination thereof.

The light-polymerizable compound is at least one of aliphatic polyurethane acrylate, polyether acrylate, acrylate, hydroxyl group-containing polyester acrylate, maleimide, phthalic imidine or 2-hydroxyl-4-phthalic imidine, a hydroxyl group-containing acid, a hydroxyl group-containing anhydride or an epoxy resin that contains multiple methyl benzol epoxy groups on the backbone.

The pigment dispersion comprises, by weight of the pigment dispersion, 5%-15% pigment, <5% dispersant, 5%-10% the first dispersion resin and 75%-85% solvent.

The photoinitiator includes at least one of ketoxime ester-type photoinitiator, α-amido ketone-type photoinitiator, acetophenone-series photoinitiator, acylphosphine oxide, aromatic ketone-type photoinitiator, aromatic sulfonium salt, iodonium salt or ferrocenium salt.

The dispersant is amide-type polymer, modified polyurethane polymer or acrylate block copolymer.

The first dispersion resin (adhesive resin) is preferably epoxy resin, which helps figment to disperse and adhere to a glass substrate, and is conducive to enhance the mechanical strength of a photoresist.

In an embodiment, the silver halide is 0.9%-1.5% by weight of the photosensitive resin composition, the oxidant is 0.06%-0.4% by weight of the photosensitive resin composition, the pigment is <6% by weight of the photosensitive resin composition, the solvent is 58%-60% by weight of the photosensitive resin composition.

It is another object of the invention to provide a color filter.

The color filter of the invention is made of the photosensitive resin composition.

The photosensitive resin composition of the invention comprises a silver halide photosensitive material and an oxidant. When the color filter made of the photosensitive resin composition is placed under a strong ultraviolet light irradiation condition, silver halide is decomposed into colloid Ag and halogen, so that the color filter exhibits black and barriers the ultraviolet light; when it is placed again in the visible light range, colloid Ag and halogen form colourless silver halide under the action of the oxidant, so that the color filter recovers the original color. When such a color filter is used, on one hand, the mask plates used during the ultraviolet curing process of a sealant may be saved; on the other hand, the destructive effect of the strong ultraviolet on the liquid crystal during the production process and the application process may be avoided, so that the product quality and the service life may be improved.

DETAILED DESCRIPTION

The photosensitive resin composition of the invention comprises, by weight of the photosensitive resin composition, 0.6%-2% silver halide, 0.06%-0.7% oxidant, 5%-15% the second dispersion resin, 5%-10% light-polymerizable compound, 25%-57% pigment dispersion, 0.05%-0.06% light polymerization initiator and 28.5%-60% solvent.

The oxidant is at least one selected from cuprous bromide-dimethyl thioether complex, copper(I) iodide-trimethyl phosphorous acid complex and copper(I) iodide-triethyl phosphorous acid complex.

The second dispersion resin is aromatic acid acrylate, styrene-maleic anhydride copolymer, polyurethane acrylate, hydroxyl group-containing polyester acrylate or a combination thereof.

The light-polymerizable compound is at least one of aliphatic polyurethane acrylate, polyether acrylate, acrylate, hydroxyl group-containing polyester acrylate, maleimide, phthalic imidine or 2-hydroxyl-4-phthalic imidine, a hydroxyl group-containing acid, a hydroxyl group-containing anhydride or an epoxy resin that contains multiple methyl benzol epoxy groups on the backbone.

The pigment dispersion comprises, by weight of the pigment dispersion, 5%-15% pigment, <5% dispersant, 5%-10% the first dispersion resin and 75%-85% solvent.

The photoinitiator includes at least one of ketoxime ester-type photoinitiator, α-amido ketone-type photoinitiator, acetophenone-series photoinitiator, acylphosphine oxide, aromatic ketone-type photoinitiator, aromatic sulfonium salt, iodonium salt or ferrocenium salt.

The solvent may be an acidic solvent, an alkaline solvent or a neutral solvent. The acidic solvent includes, for example, formic acid, acetic acid and chloroform, etc. The alkaline solvent includes, for example, ketone, ester, ether and alkaline aromatic hydrocarbons, etc. The neutral solvent includes, for example, aliphatic hydrocarbon-type and naphthenic hydrocarbon-type compound and neutral aromatic hydrocarbons, etc.; specifically, it may be aliphatic alcohol, glycol ether, ethyl acetate, methyl ethyl ketone, methyl isobutyl ketone, monomethyl ether glycolester, γ-butyrolactone, propionic acid-3-ether acetate, butyl carbitol, butyl carbitol acetate, propylene glycol monomethyl ether, propylene glycol monomethyl ether acetate, cyclohexanone, xylene, isopropyl alcohol and n-butyl alcohol; and preferably, it is one or any combination of propylene glycol monomethyl ether, propylene glycol monomethyl ether acetate, cyclohexane, butyl carbitol, propionic acid-3-ether acetate, butyl carbitol acetate and γ-butyrolactone.

The pigment is one or more selected from red pigment, yellow pigment, blue pigment, green pigment and purple pigment. The compositions of the pigment are not specifically limited, and all the existing organic pigments may be used for the above pigment dispersion. Preferably, it includes the following types: monozao yellow and orange pigment, bisazo pigment, naphthol-series pigment, naphthol AS-series pigment, azo lake-type pigment, benzimidazolone pigment, azo condensation pigment, phthalocyanine pigment, quinacridone-type pigment, thioindigo-series pigment, anthraquinone pigment, dioxazine pigment, triarylmethane-type pigment, pyrrolo-pyrrolidinedione series pigment (DPP-series pigment) and quinaphthalone-type pigment, etc. More preferably, the red pigment is selected from, for example, PR224, PR254, PR264, PR122, PR123, PR177, PR179 and PR190, etc.; the yellow pigment is selected from, for example, PY1, PY12, PY13, PY83, PY93, PY95, PY109, PY126, PY138, PY139, PY150, PY174 and PY180, etc.; the green pigment is selected from, for example, PG36, PG37, PG7 and PG58, etc.; the blue pigment is selected from, for example, PB1, PB2, PB15, PB15:3, PB15:4, PB15:6, PB16, PB22 and PB60, etc.; and the purple pigment is selected from, for example, PV32, PV36, PV38, PV39, PV23 and PV, etc.

The dispersant is amide-type polymer, modified polyurethane polymer or acrylate block copolymer.

The first dispersion resin is preferably epoxy resin, which helps pigment to disperse and adhere to a glass substrate, and is conducive to enhance the mechanical strength of a photoresist.

In an embodiment, the silver halide is 0.9%-1.5% by weight of the photosensitive resin composition, the oxidant is 0.06%-0.4% by weight of the photosensitive resin composition, the pigment is <6% by weight of the photosensitive resin composition, the solvent is 58%-60% by weight of the photosensitive resin composition.

The color filter of the invention is made of the photosensitive resin composition.

The photosensitive resin composition of the invention will be better described below in conjunction with specific embodiments. An introduction will be given by taking a red photosensitive resin as an example, and photosensitive resins of other colors may be selected and determined according to pigment solutions, which will not be limited here.

Embodiment 1

Red Photosensitive Resin Composition

1) Preparation of red pigment solution
a) mixing and stirring a dispersant BYK2001 (produced by Germany BYK) 5 g, a dispersion resin 2388 (produced by America Rohm&Haas) 80 g and propylene glycol methylether acetate 335 g for 1 hour;
b) adding a red pigment PR254 100 g into the dispersion prepared in step a, and stirring for 1 hour; and
c) adding propylene glycol methylether acetate 480 g into the dispersion prepared in step b, and grinding and dispersing for 2 hours.

2) Preparation of red photosensitive resin composition
mixing and stirring the above prepared pigment solution 200 g, dispersion resin SB401 (aromatic acid methacrylate half ester, produced by Sartomer) 25 g, photosensitive resin DPHA 19 g, photoinitiator 379 (produced by BASF) 0.2 g, silver bromide 5 g, a cuprous bromide-dimethyl thioether complex 0.8 g and propylene glycol methylether acetate 100 g for 5 hours, thereby obtaining a red photosensitive resin composition.

Embodiment 2

Red Photosensitive Resin Composition

1) Preparation of red pigment solution
a) mixing and stirring a dispersant BYK2001 5 g, a dispersion resin 2388 80 g and propylene glycol methylether acetate 335 g for 1 hour;
b) adding a red pigment PR254 100 g into the dispersion prepared in step a, and stirring for 1 hour; and
c) adding propylene glycol methylether acetate 480 g into the dispersion prepared in step b, and grinding and dispersing for 2 hours.

2) Preparation of red photosensitive resin composition:
mixing and stirring the above prepared pigment solution 200 g, dispersion resin SB401 25 g, photosensitive resin DPHA 19 g, photoinitiator 379 0.2 g, silver bromide 5 g, copper(I) iodide-trimethyl phosphorous acid complex 0.5 g and propylene glycol methylether acetate 100.3 g for 5 hours, thereby obtaining a red photosensitive resin composition.

Embodiment 3

Red Photosensitive Resin Composition

1) Preparation of red pigment solution:
   a) mixing and stirring a dispersant BYK2001 5 g, a dispersion resin 2388 80 g and propylene glycol methylether acetate 335 g for 1 hour;
   b) adding a red pigment PR254 100 g into the dispersion prepared in step a, and stirring for 1 hour; and
   c) adding propylene glycol methylether acetate 480 g into the dispersion prepared in step b, and grinding and dispersing for 2 hours.

2) Preparation of red photosensitive resin composition:
   mixing and stirring the above prepared pigment solution 200 g, dispersion resin SB401 25 g, photosensitive resin DPHA 19 g, a photoinitiator 379 0.2 g, silver bromide 3.5 g, a copper(I) iodide-triethyl phosphorous acid complex 0.3 g and propylene glycol methylether acetate 102 g for 5 hours, thereby obtaining a red photosensitive resin composition.

Application Example

A color filter is manufactured by using the red photosensitive resin composition prepared in the above embodiments 1-3, according to the steps below:

Step 1: coating the photosensitive resin composition prepared onto a glass substrate;

Step 2: drying the glass substrate obtained in Step 1 at a temperature of 150° C. for 2 minutes, and then exposing via a ultraviolet light with an exposing energy of 100-400 mJ/cm$^2$; and Step 3: developing the glass, on which Step 2 is completed, in an alkaline developing solution, and then baking it at a temperature of 250° C. for 30 minutes, thereby obtaining a color filter.

When the above prepared color filter is placed under a strong ultraviolet light irradiation condition, the color filter exhibits black and barriers the ultraviolet light; and when it is again placed in a visible light range, the color filter recovers the original color.

Finally, it should be noted that, the above embodiments are only used for illustrating the technical solutions of the invention, rather than limiting the scope of the invention. Although the invention has been illustrated in detail by referring to the above embodiments, it should be understood by one skilled in the art that, the technical solutions recorded in the above each embodiment may still be modified, or equivalent substitutions may be made to a part of the technical characteristics thereof; however, these modifications and substitutions will not make the essence of the corresponding technical solutions depart from the spirit and scope of the technical solutions of each embodiment of the invention.

What is claimed is:

1. A photosensitive resin composition, comprising, by weight of the photosensitive resin composition, 0.6%-2% silver halide, 0.06%-0.7% oxidant, 5%-15% a second dispersion resin, 5%-10% light-polymerizable compound, 25%-27% pigment dispersion, 0.05%-0.06% light polymerization initiator and 28.5%-60% solvent, wherein the oxidant is selected from the group consisting of cuprous bromide-dimethyl thioether complex, copper(I) iodide-trimethyl phosphorous acid complex and copper(I) iodide-triethyl phosphorous acid complex.

2. The photosensitive resin composition according to claim 1, wherein the second dispersion resin is aromatic acid acrylate, styrene-maleic anhydride copolymer, polyurethane acrylate, hydroxyl group-containing polyester acrylate or a combination thereof.

3. The photosensitive resin composition according to claim 1, wherein the light-polymerizable compound is at least one of aliphatic polyurethane acrylate, polyether acrylate, acrylate, hydroxyl group-containing polyester acrylate, maleimide, phthalic imidine or 2-hydroxyl-4-phthalic imidine, a hydroxyl group-containing acid, a hydroxyl group-containing anhydride or an epoxy resin that contains multiple methyl benzol epoxy groups on the backbone.

4. The photosensitive resin composition according to claim 1, wherein the pigment dispersion comprises, by weight of the pigment dispersion, 5%-15% pigment, less than 5% dispersant, 5%-10% a first dispersion resin and 75%-85% solvent.

5. The photosensitive resin composition according to claim 4, wherein the dispersant is an amide polymer, a modified polyurethane polymer or an acrylate block copolymer.

6. The photosensitive resin composition according to claim 4, wherein the first dispersion resin is epoxy resin.

7. The photosensitive resin composition according to claim 1, wherein the photoinitiator includes at least one of ketoxime ester photoinitiator, α-amido ketone photoinitiator, acetophenone-series photoinitiator, acylphosphine oxide, aromatic ketone photoinitiator, aromatic sulfonium salt, iodonium salt or ferrocenium salt.

8. The photosensitive resin composition according to claim 1, wherein said silver halide is 0.9%-1.5% by weight of the photosensitive resin composition, said oxidant is 0.06%-0.4% by weight of the photosensitive resin composition, said pigment is less than 6% by weight of the photosensitive resin composition, said solvent is 58%-60% by weight of the photosensitive resin composition.

9. A color filter, wherein the color filter is made of the photosensitive resin composition according to claim 1.

10. The color filter according to claim 9, wherein the second dispersion resin is aromatic acid acrylate, styrene-maleic anhydride copolymer, polyurethane acrylate, hydroxyl group-containing polyester acrylate or a combination thereof.

11. The color filter according to claim 9, wherein the light-polymerizable compound is at least one of aliphatic polyurethane acrylate, polyether acrylate, acrylate, hydroxyl group-containing polyester acrylate, maleimide, phthalic imidine or 2-hydroxyl-4-phthalic imidine, a hydroxyl group-containing acid, a hydroxyl group-containing anhydride or an epoxy resin that contains multiple methyl benzol epoxy groups on the backbone.

12. The color filter according to claim 9, wherein the pigment dispersion comprises, by weight of the pigment dispersion, 5%-15% pigment, less than 5% dispersant, 5%-10% the first dispersion resin and 75%-85% solvent.

13. The color filter according to claim 12, wherein the dispersant is amide polymer, modified polyurethane polymer or acrylate block copolymer.

14. The color filter according to claim 12, wherein the first dispersion resin is epoxy resin.

15. The color filter according to claim 9, wherein the photoinitiator includes at least one of ketoxime ester photoinitiator, α-amido ketone photoinitiator, acetophenone-series photoinitiator, acylphosphine oxide, aromatic ketone photoinitiator, aromatic sulfonium salt, iodonium salt or ferrocenium salt.

16. The color filter according to claim 9, wherein said silver halide is 0.9%-1.5% by weight of the photosensitive resin composition, said oxidant is 0.06%-0.4% by weight of the photosensitive resin composition, said pigment is less than 6% by weight of the photosensitive resin composition, said solvent is 58%-60% by weight of the photosensitive resin composition.

\* \* \* \* \*